United States Patent [19]

Cibert et al.

[11] Patent Number: 4,751,194

[45] Date of Patent: Jun. 14, 1988

[54] STRUCTURES INCLUDING QUANTUM WELL WIRES AND BOXES

[75] Inventors: Joel B. Cibert, St. Martin d'Heres, France; Arthur C. Gossard, Warren; Stephen J. Pearton, Summit, both of N.J.; Pierre M. Petroff, Santa Barbara, Calif.

[73] Assignee: American Telephone and Telegraph Company, AT&T Bell Laboratories, Murray Hill, N.J.

[21] Appl. No.: 879,361

[22] Filed: Jun. 27, 1986

[51] Int. Cl.$^4$ .................................. H01L 21/265
[52] U.S. Cl. ............................ 437/24; 437/126; 437/128; 437/247; 437/969; 357/16
[58] Field of Search .............. 29/572, 576 E, 569 L, 29/576 B; 148/175, 176, DIG. 60, DIG. 90, DIG. 72, DIG. 56; 437/24, 126, 128, 247, 969

[56] References Cited

U.S. PATENT DOCUMENTS

| | | | |
|---|---|---|---|
| 4,194,935 | 3/1980 | Dingle et al. | 148/175 |
| 4,503,447 | 3/1985 | Jafrate et al. | 357/12 |
| 4,575,924 | 3/1986 | Reed et al. | 29/576 E |
| 4,581,621 | 4/1986 | Reed | 357/12 |
| 4,591,889 | 5/1986 | Gossard et al. | 357/16 |

OTHER PUBLICATIONS

*Physical Review B* vol. 29, No. 12, Jun. 15, 1984, pp. 6632–6639, Hydrogenic Impurity States in Quantum Well Wire by G. W. Bryant.
*Japanese Journal of Applied Physics* vol. 22, No. 12, Dec. 1983, pp. L804–L806, Spontaneous Emission Characteristics of Quantum Well Lasers in Strong Magnetic Field-QWB Light Source by Y. Arakawa et al.
*Physical Review B* vol. 31, No. 12, Jun. 15, 1985, pp. 7812–7818, Hydrogenic Impurity States in Quantum Well Wire Shape Effects by Garrett W. Bryant.
*Ion Implantation Equipment and Techniques* Editors, H. Ryssel et al., Spring-Verlag, pp. 520–531, Rapid Isothermal Annealing for Semiconductor Applications.
*Journal of Physics C*, Solid State Phys. 19(1986) L67–L71, "Binding Energy of Donor-Phonon System in Quantum Well Wire" by A. Ercelebi et al.
*IEEE J. of Quantum Electronics* vol. 22, No. 9, Sep. 1986, pp. 1887–1899, "Quantum Well Lasers–Gain Spectra, Dynamics" by Y. Arakawa et al.
*VLSI Fab. Principles* by S. K. Ghandhi, John Wiley & Sons 1983, pp. 281–283, "Heteroepitaxy".
A New One-Dimensional Quantum Well Structure; Yia-Chung Chang, L. L. Chang, and L. Esaki; Applied Physics Letter 47 (12), Dec. 15, 1985.
Toward Quantum Well Wires: Fabrication and Optical Properties; P. M. Petroff, A. C. Gossard, R. A. Logan and W. Wiegmann; Applied Physics Letters 41 (7) Oct. 1, 1982.
Electrical Properties of Ga Ion Beam Implanted GaAs Epilayer; Yoshiro Hirayama and Hiroshi Okamoto; Japanese Journal of Applied Physics, vol. 24, No. 12, Dec. 1985, pp. L965–L967.
Ion-Species Dependence of Interdiffusion in Ion-Implanted GaAs-AlAs Suprlattices; Yoshiro Hirayama, Yoshifumi Suzuki and Hiroshi Okamoto; Japanese Journal of Applied Phyics, vol. 24, No. 11, Nov. 1985, pp. 1498–1502.
Compositional Disordering of GaAs-Al$_x$Ga$_{1-x}$AS Superlattice by Ga Focused Ion Beam Implantation and Its Application to Submicron Structure Fabrication; Yoshiro Hirayama, Yoshifumi Suzuki, Seigo Tarucha & Hiroshi Okamoto; Japanese Journal of Applied Physics, vol. 24, No. 7, Jul. 1985, pp. L516–L518.
Scattering Suppression and High-Mobility Effect of size-Quantized Electrons in Ultrafine Semiconductor Wire Structures; Hiroyuki Sakaki; Japanese Journal of Applied Physics, vol. 19, No. 12, Dec. 1980, pp. L735–L738.
The Density of Localized States in Amorphous In$_x$-Se$_{1-x}$ Thin Films; Hiroyoshi Naito, Masahiro Okuda, Tatsuhiko Matsushita and Tanehiro Nakau; Japanese Journal of Applied Physics, vol. 19, No. 9, Sep. 1980, pp. L513–L516.

*Primary Examiner*—Brian E. Hearn
*Assistant Examiner*—Kevin McAndrews
*Attorney, Agent, or Firm*—Richard D. Laumann

[57] ABSTRACT

A method of fabricating quantum well wires and boxes is described in which interdiffusion in a semiconductor having a compositional profile is enhanced by the presence of defects created by ion implantation in localized regions.

9 Claims, 3 Drawing Sheets

STRUCTURES INCLUDING QUANTUM WELL WIRES AND BOXES

TECHNICAL FIELD

This invention relates generally to semiconductor structures having compositional variations including potential wells for carrier confinement and particularly to such structures in which carriers are confined and have one or two degrees of freedom.

BACKGROUND OF THE INVENTION

In bulk semiconductors, carriers are free to move in three dimensions as their movement is not restricted by potential wells. However, interesting and useful effects arise if semiconductor structures are fabricated in which carriers have their movement restricted so that they can move in less than three dimensions. For example, heterojunctions have been fabricated with a doped wide bandgap material adjacent to an undoped narrow bandgap material. This type of structure is commonly referred to as modulation doping and has increased carrier mobility, as compared to doped bulk semiconductors, because the carriers are essentially confined to the undoped material where they have high mobility because of the reduced impurity scattering. Modulation doping is useful in field effect transistors and such transistors are commonly referred to as selectively doped heterojunction transistors (SDHT).

Additional and interesting effects may arise if the carrier motion is further confined to dimensions which are sufficiently small so that quantum effects become important. Structures demonstrating such effects are commonly referred to as quantum wells. Two dimensional quantum well structures were first demonstrated in the GaAs/GaAlAs materials system. In these quantum well structures, the carriers are free to move in two dimensions, but quantum effects are significant in the third dimension. That is, the energy levels are quantized in one dimension but form continua in the other two dimensions. Such quantum well structures are of interest because, for example, the emission frequency of a double heterostructure laser is shifted from that expected for bulk semiconductors due to the change in allowable energy levels caused by the presence of quantum effects.

The success of devices using two dimensional carrier confinement and their technological and commercial significance has led to desires for structures in which carrier movement is further restricted, i.e., structures in which carriers can move freely in one dimension (1 dimensional confinement) or in which their positions are essentially localized. It is hypothesized by those skilled in the art that quantum confinement to one and zero degrees of freedom may lead to new physical phenomena with interesting device applications, and attempts have been made to fabricate structures in which carriers are so confined. One such attempt to fabricate a one dimensional quantum well structure is described in *Applied Physics Letters*, 41, p. 635, 1982. For several proposals, see *Japanese Journal of Applied Physics*, 19, p. L735, 1980, and *Applied Physics Letters*, 47, p. 1325, 1985.

However, these proposals and attempts have not yet achieved the success that has been obtained with two dimensional quantum well structures. This relative lack of success undoubtedly has its origins in the technological difficulties associated with the fabrication of structures having, in two or three directions, dimensions which are close to the carrier de Broglie wavelengths. These wavelengths are typically less than approximately 500 Angstroms.

Structures have been fabricated having a plurality of quantum wells which are typically spaced from each other along a line perpendicular to the major surfaces of the quantum wells. These structures are, not surprisingly, commonly referred to as multiquantum well structures. Due to the periodicity of this structure, which differs from that of the underlying crystal lattice, it is sometimes referred to as a superlattice. However, the layers of a superlattice are frequently large and quantum effects are not significant.

Attempts have been made to fabricate small features in superlattices by implanting impurities to introduce compositional disordering. See, *Japanese Journal of Applied Physics*, 24, pp L516–518, July, 1985. Other studies have been performed on interdiffusion in superlattices after ion implantation.

Structures in which the carriers are confined so that they have essentially only a single degree of freedom are conveniently termed quantum well wires (QWW). By analogy, structures which restrict the carriers so that they have no degree of freedom can be aptly termed quantum well boxes (QWB).

SUMMARY OF THE INVENTION

We have found that implantation of a species into a localized region of a semiconductor having a compositional profile followed by rapid thermal annealing permits fabrication of quantum well wires (QWW) and boxes (QWB). The annealing of the implanted semiconductor results in interdiffusion of two species, for example, Al and Ga. If the localized region is near a heterojunction, the species move both across and parallel to the heterojunction. Thus, there is lateral diffusion. In this embodiment, the compositional profile comprises a first heterojunction. The implantation step creates numerous defects which permit the interdiffusion to proceed rapidly. In another embodiment, the semiconductor is a AlGaAs GaAs quantum well with two cladding layers. That is, the compositional profile comprises first and second heterojunctions. The implanted species in Ga. Multiple GaAs (AlGaAs) quantum well structures may also be used.

For reasons of clarity, the elements of the embodiments depicted are not drawn to scale.

DETAILED DESCRIPTION

An exemplary embodiment will be described first. After this description, several other embodiments and variations will be briefly mentioned and still others will be readily apparent to those skilled in the art.

Figure 1:
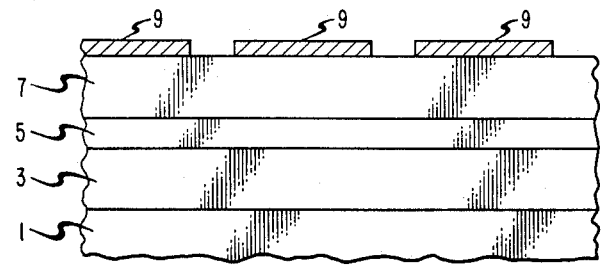
FIGS. 1–3 are useful in explaining this invention.
Figure 2:
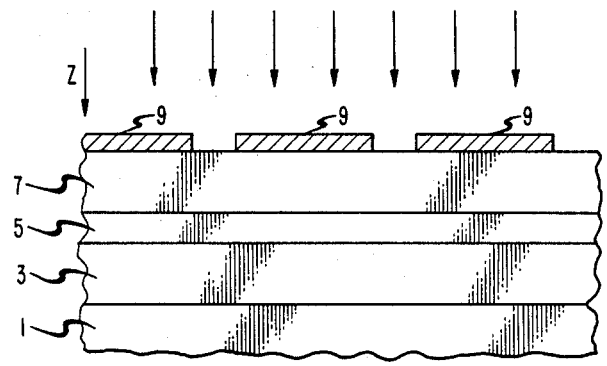
Figure 3:
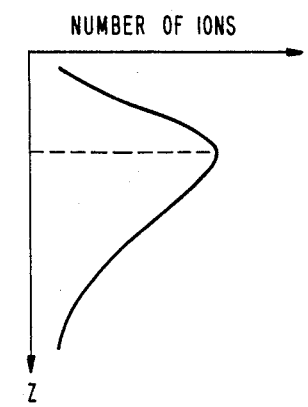
Figure 4:
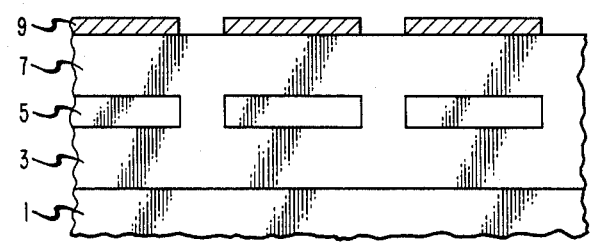
FIG. 4 is a schematic idealized representation of an exemplary embodiment of this invention.

A structure having an undoped GaAs single quantum well was grown on a (100) GaAs, Cr doped substrate. The structure had, sequentially disposed on the substrate 1, a 500 Angstrom GaAs buffer layer, a 500 Angstrom $Ga_{0.65}Al_{0.35}As$ first barrier layer 3, a 50 Angstrom GaAs quantum well 5, a 500 Angstrom $Ga_{0.65}Al_{0.35}As$ second barrier layer 7, and a 50 Angstrom GaAs cap layer. Masks 9 were formed on the surface from evaporated Ti/Au-Pd films which were approximately 0.15 μm thick. The films were then patterned using conventional electron beam lithography and lift-off processing. Metal wires and dots having sizes between 500 Angstrom and 1 μm were fabricated. The wires and dots were strips extending into the paper. A sectional view of this structure is shown in FIG. 1. For reasons of clarity, only the substrate and the two barrier layers surrounding the quantum well layer are shown as well as the mask. $Ga^+$ ions were then implanted into the quantum well region with an energy of 210 keV and a dose which was typically $5 \times 10^{13} cm^{-2}$. This step is schematically depicted in FIG. 2 and the number of ions, as a function of depth z, is depicted in FIG. 3. The dose level was typically kept lower than the amorphization threshold. It will be readily appreciated that the implantation step creates a significant number of defects. The masks were then removed using a potassium iodine solution for Au-Pd and dilute HF for Ti. A rapid thermal anneal was performed at a temperature of approximately 900 degrees C. with the epitaxial side of the wafer in contact with the GaAs wafer. The rapid thermal anneal of the implanted material results in interdiffusion of Ga and Al across the heterointerface as well as laterally underneath the mask. The anneal is typically between 5 and 15 seconds although somewhat longer times, say approximately 5 minutes, can be used. An idealized representation of the resulting structure is shown in FIG. 4. The anneal has resulted in interdiffusion of Ga and Al to form the wires shown. That is, Al and Ga move into and out of, respectively the quantum well region. Since AlGaAs has a larger bandgap than does GaAs, quantum well wires and boxes are formed underneath the mask. As will be understood by those skilled in the art, the wires and boxes are perpendicular to the plane of the page. An anneal for a shorter period will result in less complete interdiffusion of the Ga and Al.

The particular species chosen for the implant step is not critical. Species other than constituents of the semiconductors may be used. However, the semiconductor must have two species which will interdiffuse. It must also have a compositional profile in which the two species have a varying concentration. The rapid thermal annealing step then permits the two species to come to an equilibrium via the mechanism of the defect enhanced interdiffusion. That is, the diffusion coefficient is much larger in the damaged material than in the undamaged material.

Figure 5:
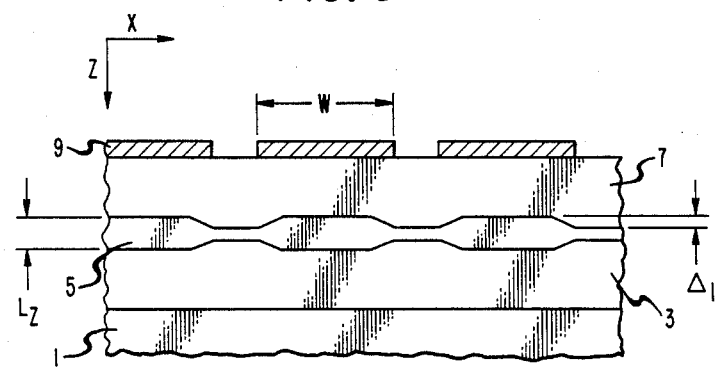
FIG. 5 is a schematic representation of another exemplary embodiment of this invention.

A more realistic schematic representation of the resulting structure is depicted in FIG. 5. Depicted as GaAs buffer layer 1, barrier layers 3 and 7, quantum well layer 5, and mask 9. $L_z$ is the original quantum well layer thickness. $\Delta_i$ is the interdiffusion length. To facilitate discussion, the z and y directions are also explicitly indicated. The variation of the Al concentration along the direction perpendicular, i.e., the z direction, to the interface is given by an error function. Along the y direction, the interdiffusion under the masks decreases smoothly as will be described. The local bandgap is proportional to the aluminum concentration. Thus, as the Al content increases in what was the quantum well layer, GaAs wires are formed.

The energy for implantation is chosen so that the implanted species is deposited in the desired localized region. The appropriate choice will be readily made by those skilled in the art.

The time and temperature should be sufficiently long and high, respectively, that the desired amount of interdiffusion occurs. It will be appreciated that for some applications complete interdiffusion will not be desired. Appropriate choices will be readily made by those skilled in the art.

The confinement energy of an electron in a 1000 Angstrom quantum well is relatively small, for example, less than 1 meV. The potential well profile perpendicular to the wires is characterized by three parameters: (1) the mask size, (2) the implantation lateral straggling, and (3) the diffusion length of the defect which enhances the interdiffusion. For large masks, that is, over 3500 Angstroms in width the confinement effects are either absent or too small to be resolved. For smaller masks, the profile is not square but rather is rounded. In this potential, the splitting between the first two energy levels is typically larger than in a square well having the same width but it decreases as the quantum number of the energy level increases. However, further decreases in the mask size no longer change the width of the potential which will be defined mainly by the straggling and the defect diffusion length. This is due to the increased interdiffusion of Al into the GaAs QWW, which will reduce the conduction band offset for the confinement in the y direction.

It should be noted that there is a significant amount of lateral diffusion, i.e., diffusion under the mask. Some of this is the result of lateral straggling during the implantation step which leads to lateral defect diffusion during the annealing step. A graded profile, i.e., a varying bandgap, under the mask in the y direction is then produced by the annealing step.

The structures described are useful in many applications. For example, graded bandgap structures can be easily achieved laterally. This is in contrast to molecular beam epitaxy which typically permits graded bandgap structures to be fabricated only in the vertical, that is, growth, direction. A suitable mask is shown in a top view in FIG. 6. The implanted zones have a width, which increases from left to right. Thus, the implanted area, and thus the dose, also increases. However, the dose per unit area is the same. The effective bandgap structure for the thermally annealed AlGaAs is depicted in FIG. 7 for both the conduction and valence bands. As can be seen, the bandgap increases monotonically from left to right as there is more interdiffusin of Al and Ga. These laterally graded devices have two degrees of freedom for introducing built-in fields in a structure without etching.

Other embodiments are also contemplated. For example, very small waveguides may be easily fabricated.

Figure 6:
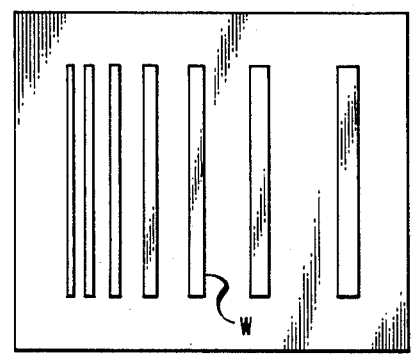
FIGS. 6–7 illustrate yet another embodiment.
Figure 7:
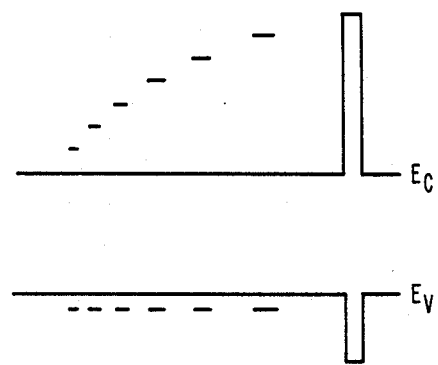

Additionally, gratings may be fabricated by using a slight modification, namely, equivalent intermixing in the implanted areas, of the mask depicted in FIG. 6. These gratings may be used in many applications, such as, e.g., the external grating in a single frequency laser. Additionally, the grating may be optically coupled to the active layer of a double heterostructure to form a distributed feedback laser. As will be readily appreciated by those skilled in the art, no regrowth over the grating is required. It is also contemplated that the quantum well wires and boxes may be part of semiconductor lasers. Chemical dopants may be added to assist carrier relaxation to the ground state.

What is claimed is:

1. A method of fabricating a semiconductor structure comprising the steps of implanting a species into localized regions of a semiconductor body having a compositional profile, said compositional profile comprising first and second heterojunctions thereby forming a potential well region, said species being implanted into said potential well region which comprises one or more quantum well wires, said implanting having a dose level less than the amorphization threshold, and creating defects, said semiconductor comprising at least two species, and rapidly annealing said semiconductor structure to thereby cause interdiffusion of at least two species of said semiconductor via defect enhanced mechanisms.

2. A method as recited in claim 1 in which said semiconductor body comprises Group III-V compound semiconductors.

3. A method as recited in claim 2 in which said Group III-V semiconductors comprise GaAlAs.

4. A method as recited in claim 3 in which said implanted species comprises Ga.

5. A method as recited in claim 1 in which said wires have varying widths.

6. A method of fabricating a semiconductor structure comprising the steps of implanting a species into localized regions of a semiconductor body having a compositional profile, said compositional profile comprising first and second heterojunctions thereby forming a potential well region, said species being implanted into said potential well region, said regions comprising lines having varying widths, said implanting having a dose level less than the amorphization threshold, and creating defects, said semiconductor comprising at least two species, and rapidly annealing said semiconductor structure to thereby cause interdiffusion of at least two species of said semiconductor via defect enhanced mechanisms, said annealing produces a laterally varying bandgap of said semiconductor body.

7. A method as recited in claim 1 in which said implanting produces a plurality of boxes in said semiconductor body.

8. A method as recited in claim 7 in which said boxes comprise quantum well boxes.

9. A device fabricated by the method of claim 1.

* * * * *